US007671601B2

(12) United States Patent
Takayama

(10) Patent No.: US 7,671,601 B2
(45) Date of Patent: Mar. 2, 2010

(54) ABNORMAL CONDITION DETECTING SYSTEM FOR ENGINE

(75) Inventor: Eiji Takayama, Anjo (JP)

(73) Assignee: DENSO Corporation, Kariya (JP)

( * ) Notice: Subject to any disclaimer, the term of this patent is extended or adjusted under 35 U.S.C. 154(b) by 445 days.

(21) Appl. No.: 11/590,766

(22) Filed: Nov. 1, 2006

(65) Prior Publication Data

US 2007/0095131 A1 May 3, 2007

(30) Foreign Application Priority Data

Nov. 2, 2005 (JP) ............................. 2005-319950

(51) Int. Cl.
*G01R 31/00* (2006.01)
*F02B 47/08* (2006.01)

(52) U.S. Cl. ................... 324/503; 324/378; 123/568.16

(58) Field of Classification Search ................. 324/503, 324/378; 123/568.16, 568.14
See application file for complete search history.

(56) References Cited

U.S. PATENT DOCUMENTS 3,915,134 A * 10/1975 Young et al. ........... 123/568.24
4,375,800 A * 3/1983 Otsuka et al. ............... 123/698
4,541,398 A * 9/1985 Kishi .................... 123/568.16
5,474,051 A * 12/1995 Matsumoto et al. .... 123/568.16
6,257,214 B1 * 7/2001 Bidner et al. .......... 123/568.16
7,100,586 B2 * 9/2006 Matsumoto ............ 123/568.16
7,121,256 B2 * 10/2006 Tsukui et al. ............... 123/336
7,137,252 B2 * 11/2006 Ando et al. .................... 60/602

FOREIGN PATENT DOCUMENTS

JP 05-168284 8/1993
JP 09-131083 5/1997
JP 10-176584 6/1998
JP 11-257103 9/1999

OTHER PUBLICATIONS

Office Action issued Jun. 16, 2009 in corresponding Japanese Application No. 2005-319950 and an at least partial English language translation thereof.

* cited by examiner

*Primary Examiner*—Timothy J Dole
*Assistant Examiner*—John Zhu
(74) *Attorney, Agent, or Firm*—Nixon & Vanderhye P.C.

(57) ABSTRACT

In an abnormal condition detecting system, an electronic control unit determines that a condition for carrying out a process for detecting an abnormal condition of an electric motor and/or electric supply lines for the motor is satisfied, when a position of a control valve is at its initial closed position. Then, the electronic control unit stops supply of the electrical power to the electric motor, to start a detection of the abnormal condition (electrical disconnection) in the motor and/or the electric supply lines.

2 Claims, 8 Drawing Sheets

| MODE | Q1 | Q2 | Q3 | Q4 |
|---|---|---|---|---|
| MOTOR STOPPED | OFF | OFF | OFF | OFF |
| MOTOR FORWARD ROTATION | ON | OFF | OFF | ON |
| MOTOR BACKWARD ROTATION | OFF | ON | ON | OFF |

ABNORMAL CONDITION DETECTING SYSTEM FOR ENGINE

CROSS REFERENCE TO RELATED APPLICATION

This application is based on Japanese Patent Application No. 2005-319950 filed on Nov. 2, 2005, the disclosure of which is incorporated herein by reference.

FIELD OF THE INVENTION

The present invention relates to an abnormal condition detecting system for an engine. The present invention is preferably applied to an abnormal condition detecting apparatus for a motor driving device, for example, an exhaust gas recirculation apparatus for controlling amount of recirculation gas for an internal combustion engine.

BACKGROUND OF THE INVENTION

An exhaust gas recirculation apparatus (an EGR apparatus) is known in the art as an engine control system, in which an amount of recirculation gas (re-circulated exhaust gas) is controlled to reduce nitrogen oxides (NOx) contained in the exhaust gas from an engine. In the EGR apparatus, an EGR valve is provided in an exhaust gas recirculation pipe, and the EGR valve is driven by an electric motor to control the amount of the re-circulated exhaust gas. When any malfunction occurs in the EGR valve, the control for the amount of re-circulated exhaust gas can not be carried out. Accordingly, it is necessary to detect an abnormal condition, such as an electrical disconnection, a condition in which an output from the motor is fixed, and so on.

In Japanese Patent Publication No. H5-168284, an abnormal condition detecting device is disclosed, according to which a power supply from a motor driving circuit to a motor is stopped and an abnormal condition is detected based on a voltage behavior immediately after the stop of the power supply. When the motor is in the abnormal condition (e.g. the motor can not be rotated), a flyback voltage is generated shortly after the power supply to the motor is cut off. On the other hand, when the motor is in the normal condition, no flyback voltage is generated and instead the voltage is gradually increased as the rotational speed of the motor is decreased. The abnormal condition is detected based on such a difference of the above voltage behavior, that is, a transient change of the voltage during the power supply to the motor is stopped.

In the above prior art, it is necessary to temporally stop the power supply from the motor driving circuit to the motor in order to detect the abnormal condition in the motor of the EGR apparatus, or in power supply lines of a wire harness electrically connecting the motor driving circuit with the motor.

The EGR valve may be moved to its initial position (e.g. a fully closed position), when the power supply to the motor is stopped, even when the period of such power supply stop is short. In the case that the valve position was at its half-opened or full-opened position just before the power supply to the motor is cut off, the EGR valve may be quickly moved to its initial closing position due to the cut-off of the power supply.

If the power supply to the motor is even temporally stopped for the purpose of detecting the abnormal condition of the EGR apparatus, the operation for the EGR control can not be temporally performed. This would result in deterioration of exhaust gas and/or drivability and a generation of noise to be caused by a rapid movement of the EGR valve to its valve closing position.

SUMMARY OF THE INVENTION

The present invention is made in view of the foregoing problems, and has an object to provide an abnormal condition detecting apparatus for an engine, according to which an abnormal condition of a motor for an engine control system can be detected without affecting an operation of the engine control.

According to one of features of the invention, an abnormal condition detecting device for an engine control system has: an electric motor and a control member driven by the electric motor for controlling physical quantity related to engine performance; a position sensor for detecting a position of the control member; and an electronic control unit for driving the electric motor in accordance with operational condition of an engine, so that an actual physical quantity is controlled to reach a target physical quantity calculated by the electronic control unit based on the operational condition of the engine.

The electronic control unit has: a motor driving circuit for supplying electrical power to the electric motor through power supply lines; and an abnormal condition detecting circuit for detecting an electrical abnormal condition of the electric motor and/or the power supply lines, when the power supply from the motor driving circuit, to the electric motor is stopped.

The electronic control unit performs the following steps:

a step for determining that a condition for carrying out a process for detecting the abnormal condition is satisfied, when the position of the control member is at its initial position;

a step for stopping the power supply to the electric motor when the electronic control unit determines that the condition for carrying out the process for detecting the abnormal condition is satisfied; and a step for determining whether any electrical abnormal condition occurs in the electric motor and/or the power supply lines.

According to another feature of the present invention, an abnormal condition detecting device for an engine control system has: an electric motor and a control member driven by the electric motor for controlling physical quantity related to engine performance; a position sensor for detecting a position of the control member; and an electronic control unit for driving the electric motor in accordance with operational condition of an engine, so that an actual physical quantity is controlled to reach a target physical quantity calculated by the electronic control unit based on the operational condition of the engine.

The electronic control unit has: a motor driving circuit for supplying electrical power to the electric motor through power supply lines; and an abnormal condition detecting circuit for detecting an electrical abnormal condition of the electric motor and/or the power supply lines, when the power supply from the motor driving circuit to the electric motor is stopped.

The electronic control unit performs the following steps:

a step for determining whether the control member is controlled in a normal operating condition;

a step for determining that a condition for carrying out a process for detecting the abnormal condition is satisfied, when the control member is controlled in the normal operating condition and the position of the control member is at its initial position;

a step for stopping the power supply to the electric motor when the electronic control unit determines that the condition for carrying out the process for detecting the abnormal condition is satisfied; and a step for determining whether any electrical abnormal condition occurs in the electric motor and/or the power supply lines.

According to a further feature of the present invention, an abnormal condition detecting device for an engine control system has: an electric motor and a control member driven by the electric motor for controlling physical quantity related to engine performance; a position sensor for detecting a position of the control member; and an electronic control unit for driving the electric motor in accordance with operational condition of an engine, so that an actual physical quantity is controlled to reach a target physical quantity calculated by the electronic control unit based on the operational condition of the engine.

The electronic control unit has: a motor driving circuit for supplying electrical power to the electric motor through power supply lines; and an abnormal condition detecting circuit for detecting an electrical abnormal condition of the electric motor and/or the power supply lines, when the power supply from the motor driving circuit to the electric motor is stopped.

The electronic control unit performs the following steps:

a step for detecting whether an engine start signal is received after an ignition key is inserted into a key cylinder of a vehicle;

the above step determining that a condition for detecting the abnormal condition for the electric motor and/or power supply lines is satisfied, when the ignition key is inserted into the key cylinder and the engine start signal is not received; and a step for determining whether any electrical abnormal condition occurs in the electric motor and the power supply lines.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

An engine control system (including an abnormal condition detecting system) according to a first embodiment of the present invention will be explained with reference to the accompanying drawings.

Figure 1:
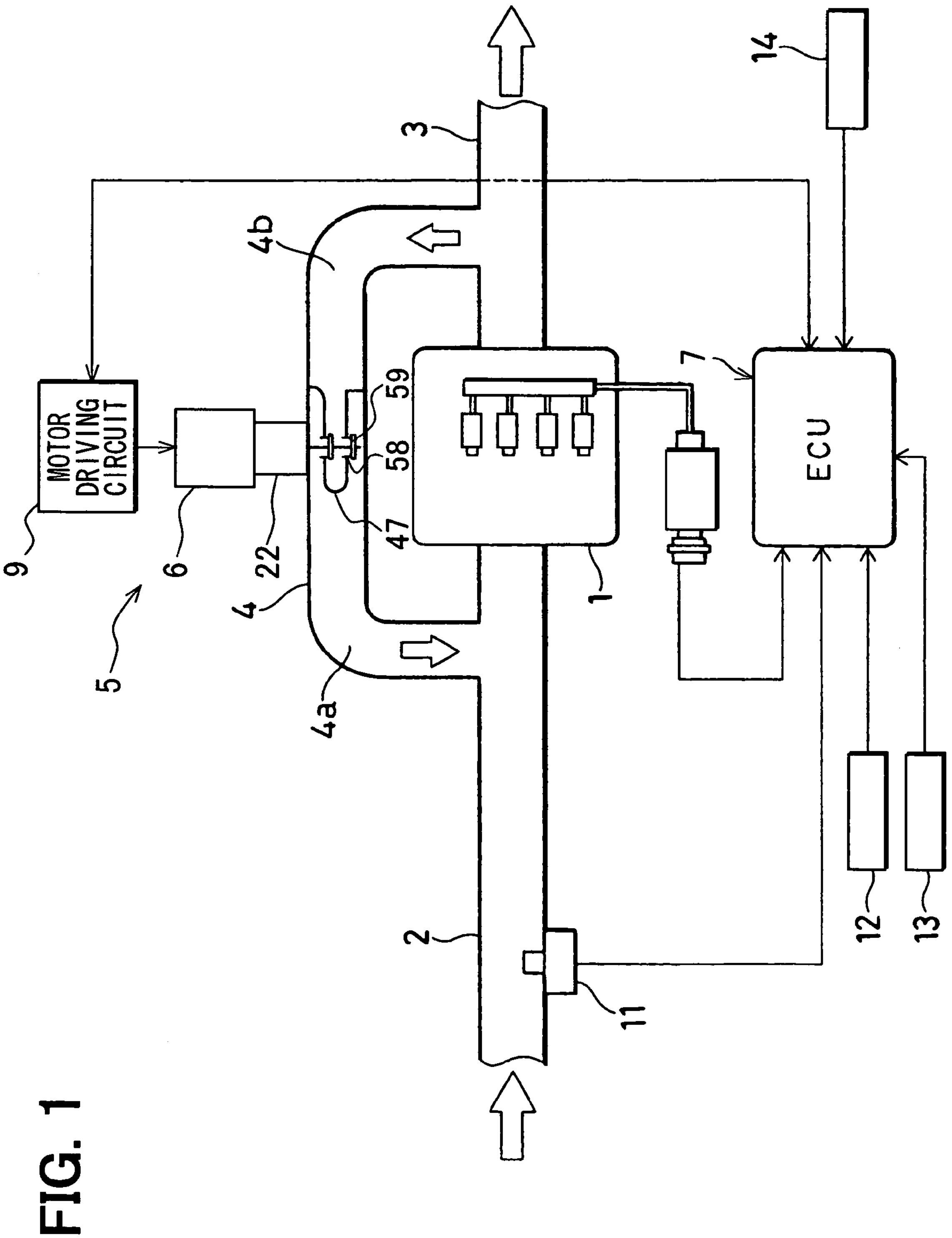
FIG. 1 is a schematic view showing an exhaust gas recirculation apparatus for an internal combustion engine, according to a first embodiment of the present invention.
Figures 2, 3:
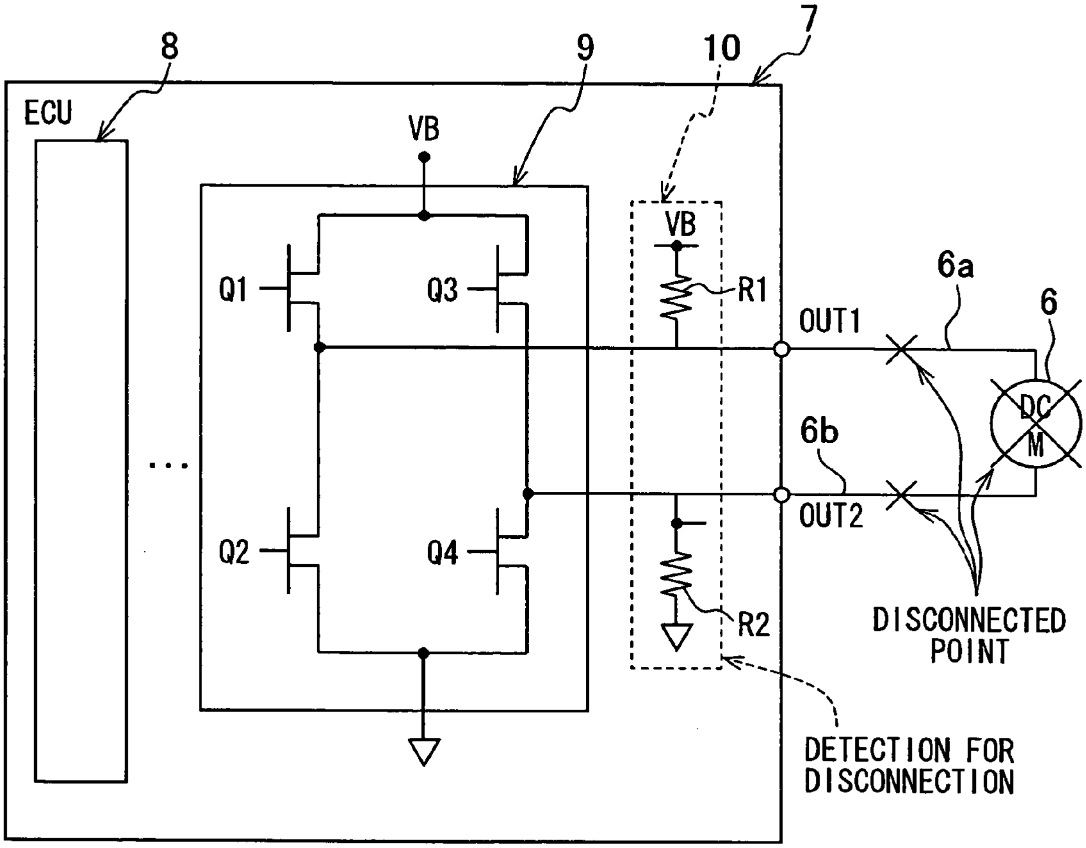
FIG. 2 is a schematic block diagram showing an electrical structure of a motor driving circuit shown in FIG. 1.
FIG. 3 is an explanation table for operational modes of the motor driving circuit shown in FIG. 2.
Figure 4:
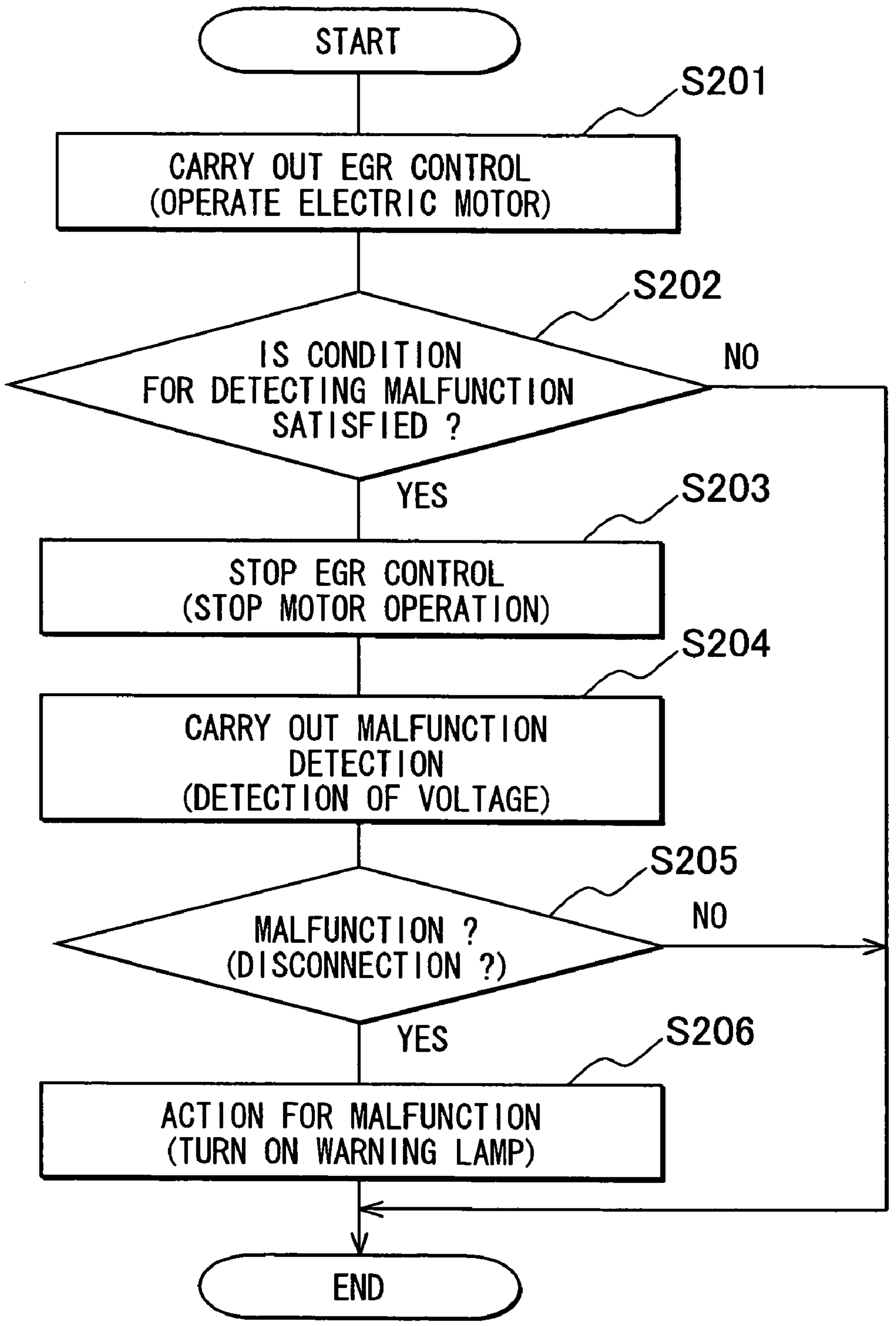
FIG. 4 is a flow chart of a control process for detecting an abnormal condition of the exhaust gas recirculation apparatus.

FIG. 1 is a schematic view showing a structure of an exhaust gas recirculation (EGR) apparatus, to which the engine control system for an internal combustion engine according to an embodiment of the present invention is applied. FIG. 2 is a schematic block diagram showing an electrical structure of a motor driving circuit shown in FIG. 1. FIG. 3 is an explanation table for operational modes of the motor driving circuit shown in FIG. 2. FIG. 4 is a flow chart of a control process for detecting an abnormal condition of the exhaust gas recirculation apparatus.

An engine control system 5 is mounted to an internal combustion engine 1, for example a diesel engine, and adjusts a physical quantity, such as exhaust gas recirculation amount, related to engine performance. The engine 1 is mounted in an automotive vehicle (not shown). In the first embodiment, the engine control system 5 is applied to the EGR apparatus.

The engine 1 has a fuel injection apparatus (not shown), in addition to the EGR apparatus 5, for injecting fuel into respective engine cylinders (not shown). The fuel injection apparatus is composed of a high pressure pump (not shown) for sucking fuel from a fuel tank and discharging the fuel after pressurizing the same, a common rail (not shown) for storing the high pressure fuel from the high pressure pump at a predetermined fuel pressure (a common rail pressure) corresponding to a fuel injection pressure, and injectors (not shown) for injecting the high pressure fuel into the respective engine cylinders, and so on.

As shown in FIG. 1, the EGR apparatus 5 has an intake pipe 2 for intake air to the engine 1, an exhaust pipe 3 for exhaust gas, an EGR pipe 4 for re-circulating a part of the exhaust gas from the exhaust pipe 3 to the intake pipe 2, an EGR valve device (6, 22, 47, 58, 59) provided in the EGR pipe 4, and an electronic control unit (ECU) 7 for controlling an opening degree of the EGR valve device. The EGR apparatus 5 increases a ratio of inactive gas in air-fuel mixture to the engine 1 by the re-circulated exhaust gas (EGR gas), in order to decrease a maximum combustion temperature and thereby reduce emission of nitrogen oxides (NOx).

The EGR valve device has a partitioning wall 47 for partitioning the EGR pipe 4 into a first pipe portion 4*a* connected to the intake pipe 2 and a second pipe portion 4*b* connected to the exhaust pipe 3. The EGR valve device has a pair of valve seats 58 formed in the partitioning wall 47, and a pair of valve bodies 59 (also referred to as a control member) for opening and closing passages formed at the valve seats 58. The valve bodies 59 are driven in an axial direction (upward and downward directions in FIG. 1) to perform the opening and closing operation.

The EGR valve device further has an electric motor 6 for controlling lift amounts of the valve bodies 59, wherein the valve bodies 59 are lifted up or down by the rotation of the electric motor 6 in its forward or backward direction.

The valve structure for controlling the re-circulated amount of the EGR gas through the EGR pipe 4 is not limited to the valve bodies 59, which are axially moved. Other types of the valve structure, for example, a butterfly valve, may be used, wherein an opening degree of the passage for the EGR gas is adjusted by the rotation of the electric motor 6 between its fully closed position and its fully opened position According to the EGR valve device of the embodiment, the lifted amount of the valve bodies 59 is controlled by driving the electric motor 6 with a control signal from the ECU 7, wherein the opening degree of the EGR pipe 4 is adjusted from 0% to 100%. The lifted amount of the valve bodies 59 is detected by a lift sensor 22 (also referred to as a position sensor). The EGR valve device fully closes the EGR pipe 4 during an acceleration of the engine 1 with a full throttle opening.

The electric motor 6 is, for example, a brushless DC motor having a rotor (not shown) integrally connected to an output shaft (a motor shaft), and a stator (not shown) arranged at an outer periphery of the rotor. The rotor is composed of a rotor core (not shown) having permanent magnets, whereas the stator is composed of a stator core wound with an armature coil (an armature winding). Instead of the brushless DC motor, any other types of the motor, for example, a DC motor having brushes, an AC (alternating current) motor such as a three-phase induction motor, may be used.

The ECU 7 has a well known microcomputer, which is composed of CPU 8 for carrying out control processes and calculating processes, a memory device (memories, such as ROM, EEPROM, RAM, a stand-by RAM, etc.) for storing various control programs and data, an input circuit, an output circuit, a power source circuit, and so on. The ECU 7 further has a motor driving circuit 9 for applying a motor driving current to the electric motor 6 of the EGR valve device.

The ECU 7 further has a pump driving circuit (not shown) for applying a driving current to a suction amount control valve of a high pressure pump (not shown), and an injector driving circuit (not shown) for applying a driving current to an electromagnetic valve of a fuel injector (not shown).

When an ignition switch is turned on (IG-ON), the ECU 7 starts with its feedback control in accordance with the control programs and control logics stored in the memory device, so that an actual value,. for example a fuel pressure in the common rail (the common rail pressure), the re-circulated amount of the EGR gas and the like, is controlled at a target value.

The ECU 7 controls the operation of the engine 1 (including the control of the EGR valve device) depending on operational conditions of the vehicle. Various kinds of sensors for detecting the operational condition of the vehicle are provided, and detected signals are inputted to the ECU 7. As examples for detecting the operational conditions, as shown in FIG. 1, a throttle position sensor 12 for detecting an opening degree of a throttle valve driven by an acceleration pedal operated by a vehicle driver, a rotational speed sensor 13 for detecting a rotational speed of the engine 1, a temperature sensor 14 for detecting a temperature of engine cooling water, and the lift sensor 22 for detecting the lifted amount of the valve bodies 59 are provided.

The ECU 7 calculates a target lift amount (corresponding to a target opening degree) for the EGR valve device (the valve bodies 59) based on a map and/or a calculation formula, in accordance with the operational condition of the vehicle (and engine) detected by the various sensors. The ECU 7 controls an actual lifted amount (corresponding to an actual opening degree of the EGR valve device) in a feedback control manner, so that the actual amount is adjusted to be close to the target amount.

As shown in FIG. 2, the motor driving circuit 9 has an H-shaped bridge circuit for changing a forward rotation of the motor 6 to a backward rotation, and vise-versa. The H-shaped bridge circuit is composed of switching elements Q1, Q2, Q3, and Q4, made of FET. When a driving signal from the CPU 8 is at a high level, the switching elements Q1 and Q4 are turned on, whereas the switching elements Q2 and Q3 are turned off, as indicated in FIG. 3. On the other hand, when the driving signal from the CPU 8 is at a low level, the switching elements Q2 and Q3 are turned on, whereas the switching elements Q1 and Q4 are turned off.

When the switching elements Q1 and Q4 are turned on, the electric current flows through a circuit of the switching element Q1, the motor 6 and the switching element Q4, so that the motor 6 is rotated in one direction (the forward direction). On the other hand, the switching elements Q2 and Q3 are turned on, the electric current flows through a circuit of the switching element Q3, the motor 6 and the switching element Q2, so that the motor 6 is rotated in a reversed direction (the backward direction). In the case that all of the switching elements Q1 to Q4 are turned off, the motor 6 stops its rotation.

The driving signal from the CPU 8 is, for example, a PWM signal (pulse width modulation). The motor driving circuit 9 calculates a control pulse having a duty ratio (an output DUTY), which is pulse modulated such that a difference between the target value (the target opening degree) calculated from the operational condition of the engine 1 and the actual opening degree (a lifted amount signal from the lift sensor 22) becomes close to each-other (zero). The motor driving circuit 9 out puts to the motor 6*a* driving current (an output current DUTY), which is formed from the control pulse having the duty ratio (the out put DUTY). Accordingly ,a driving power (a torque for a motor output shaft) is generated at the motor 6, corresponding to the driving current, and the actual opening degree of the EGR valve device is finally controlled to coincide with the target opening degree.

In addition to the motor driving circuit 9, the ECU 7 has an abnormal condition detecting circuit 10 between the motor 6 and the motor driving circuit 9, as shown in FIG. 2. The abnormal condition detecting circuit 10 has a resister R1 connected to one (6*a*) of power supply lines to the motor 6, on a side indicated by "OUT 1", and another resister R2 connected to the other power supply line 6*b* to the motor 6, on a side indicated by "OUT 2", wherein the other end of the resister R1 is connected to a power source (VB) and the other end of the resister R2 is grounded. According to the abnormal condition detecting circuit 10, when the power supply of the electric current from the motor driving circuit 9 to the motor 6 is cut off, the electric current flows from the power source (VB) through a circuit of the resister R, the motor 6, and the resister R2. In the case that the motor 6 and the power supply lines 6*a* and 6*b* are in a normal condition, a voltage detected across the resister R2 becomes a value of $VB-\Delta V$, wherein $\Delta V$ is a voltage drop amount at the resister R and the motor 6. On the other hand, if any abnormal condition happens to occur, wherein a disconnection occurs in the motor 6 or the power supply lines 6*a*, 6*b*, the voltage detected across the resister R2 becomes zero.

An operational condition for cutting off the power supply to the motor 6 for the purpose of detecting the abnormal condition will be explained below.

The ECU 7 carries out the fuel injection control, the control for the EGR apparatus 5, the control for detecting the abnormal condition of the EGR apparatus 5, and so on. In the fuel injection control, the ECU 7 calculates an amount of fuel injection as well as fuel injection timing based on the operational condition of the engine 1, and controls the supply of the electric current to the injectors in accordance with the calculated fuel injection amount and timing.

When the ECU 7 carries out the EGR control, the ECU 7 determines at first whether a condition for the EGR control (a condition for motor driving) is satisfied based on the rotational speed of the engine, the temperature of the engine cooling water, the opening degree of the acceleration pedal, and so on. When the condition for the motor driving is not satisfied, the EGR valve device is kept at its fully closed condition. When the condition for the motor driving is satisfied, the ECU 7 calculates the target opening degree of the EGR valve device based on the control map and in accordance with the rotational speed of the engine 1 as well as the fuel injection amount. Then, the ECU 7 drives the motor 6 based on the calculated target opening degree.

An operation for detecting the abnormal condition of the EGR apparatus 5, more particularly, the abnormal condition of the motor 6 and/or the power supply lines 6*a*, 6*b*, will be explained with reference to FIG. 4.

At a step S201 shown in FIG. 4, the ECU 7 reads the operational condition of the engine 1 and carries out the control for the opening degree of the EGR valve device. More particularly, in the case that the motor driving condition is met, the ECU 7 carries out the electrical power supply from the motor driving circuit 9 to the motor 6 to drive the same and controls the rotation thereof. The ECU 7 selects the forward rotation or the backward rotation of the motor 6, in accordance with the control signal (the PWM signal) from CPU 8, which is outputted based on the difference between the target opening value and the actual opening value.

In the case that the motor driving condition is not met, the power supply from the motor driving circuit 9 to the motor 6 is cut off, so that the EGR valve device is controlled to close its passage. In this situation, the amount of the EGR gas (or the ratio of the EGR gas) in the intake air becomes to its minimum value (zero).

At a step S202, the ECU 7 determines whether the condition for carrying out a process for detecting the abnormal condition (malfunction) is satisfied or not. More specifically, the ECU 7 determines whether the EGR valve device is in its fully closed position based on the detected signal from the lift sensor 22. And when the EGR valve device is in the fully closed position, the ECU 7 determines that the condition for carrying out the process for detecting the abnormal condition is satisfied.

Then, the process goes to a step S203, at which the operation for the EGR control is temporally stopped, during a period in which the operation for detecting the abnormal condition is performed.

On the other hand, the ECU 7 determines that the condition for detecting the abnormal condition is not satisfied, when the EGR valve device is not in the fully closed position, and the process goes to the end. This means that the operation (the step S201) for the EGR control is also terminated. In this case, however, the operation for the EGR control may be continued until the ECU 7 determines that the condition for detecting the abnormal condition is satisfied.

The condition, in which the EGR valve device is in its fully closed position, is the condition for stopping the power supply to the motor 6 for detecting the abnormal condition of the EGR apparatus. When the condition for detecting the abnormal condition is satisfied, namely when the condition for stopping the power supply to the motor 6 is satisfied, the ECU 7 operates the motor driving circuit 9 in order that the power supply to the motor 6 is stopped. In this case, the EGR valve device is kept at its initial position (the fully closed position).

At a step S204, the abnormal condition detecting circuit 10 detects whether there is any abnormal condition (electrical malfunction) of the EGR apparatus (namely, disconnection in the motor 6 or the power supply lines 6*a*, 6*b*), during a period in which the motor driving circuit 9 stops the operation of the electric motor 6.

At a step S205, the ECU 7 determines whether the abnormal condition of the motor 6 or the power supply lines 6*a*, 6*b* are caused by the disconnection. More specifically, the ECU 7 determines the abnormal condition caused by the disconnection, by judging whether the detected voltage "V" at the abnormal condition detecting circuit 10 is higher than a predetermined value "V0".

When the detected voltage "V" of the abnormal condition detecting circuit 10 (the voltage across the resister R2) is determined to be higher than the predetermined value "V0", the detected voltage "V" is regarded as to be higher than a voltage (VB−ΔV), which is the voltage deducted by the voltage drops at the resister R and the motor 6 (the resister R of the motor 6) from the power supply voltage VB. As a result, the ECU 7 determines that the motor 6 as well as the power supply lines 6*a*, 6*b* are in the normal condition.

On the other hand, when the detected voltage "V" of the abnormal condition detecting circuit 10 is determined to be lower than the predetermined value "V0", the ECU 7 determines that the motor 6 or the power supply lines 6*a*, 6*b* are in the abnormal condition (disconnected). Then, the process goes to a step S206.

At the step S206, the ECU 7 takes an action for the abnormal condition of the disconnection in the EGR apparatus 5. For example, the ECU 7 turns on a lamp in order to give a warning to the vehicle driver that the disconnection has occurred in the motor 6 or the power supply lines 6*a*, 6*b*. In addition, the engine 1 is operated in a limited operational condition, so that a safe running of the engine 1 as well as the vehicle is maintained The step S202 constitutes a means for detecting the condition for stopping the power supply from the motor driving circuit 9 to the motor 6, for the purpose of detecting the abnormal condition. The fully closed valve position of the EGR valve device corresponds to the initial position of the motor 6. In the fully closed valve position, the amount of the EGR gas (or the ratio of the EGR gas) in the intake air becomes to its minimum value (zero).

In a conventional EGR apparatus, ECU controls an EGR valve by driving a motor such that an actual opening degree of the EGR valve coincides with a target opening degree, and the ECU stops the power supply from a motor driving circuit to the motor for the purpose of detecting an abnormal condition. However, in such a conventional EGR apparatus, the actual opening degree of the EGR valve before stopping the power supply may be changed after stopping the power supply to the motor. If the opening degree of the EGR valve after stopping the power supply to the motor was displaced from the target opening degree to a large extent, the ratio of the EGR gas in the intake air would be largely deviated from a target value for the engine requirement. This would result in deterioration of exhaust gas and/or drivability.

On the other hand, the ECU 7 according to the embodiment of the invention has the means for detecting the condition for stopping the power supply from the motor driving circuit 9 to the motor 6, for the purpose of detecting the abnormal condition. The detecting means determines whether or not the motor 6 of the EGR valve device is in its initial position. And when the ECU 7 determines that the initial position is maintained, the ECU 7 determines that the condition for stopping the power supply is satisfied.

As above, the condition for stopping the power supply is provided (and detected) in the process of operation carried by the ECU 7, for the purpose of detecting the abnormal condition. Accordingly, even during the operation of the EGR valve device, in other words, during the operation of EGR control, the actual opening position of the EGR valve device is not deviated from the target value when the power supply to the motor 6 is stopped.

As a result, the abnormal condition can be detected without causing an adverse affect to the EGR control for the engine 1, even when the power supply to the motor 6 is stopped for the purpose of detecting the abnormal condition, such as the disconnection in the motor 6 and/or the power supply lines 6*a*, 6*b* of the EGR valve device.

As explained above, if the actual opening degree of the EGR valve after stopping the power supply to the motor was displaced from the target opening degree to a large extent, the ratio of the EGR gas in the intake air would be largely deviated from the target value for the engine requirement. This would result in a generation of noise to be caused by a rapid movement of the EGR valve to its valve closing position, in addition to the deterioration of exhaust gas and/or drivability.

On the other hand, according to the embodiment of the invention, the initial position of the motor 6 for carrying out the process of stopping the power supply corresponds to the fully closed position of the EGR valve device, namely it corresponds to an engine operation in which the ratio of the EGR gas in the intake air is at its minimum value (zero), for example during the engine accelerating operation of the full throttle. Therefore, even when the power supply to the motor 6 is stopped during such engine operation, for the purpose of detecting the abnormal condition of the EGR apparatus, the actual opening degree of the EGR valve device is maintained at its fully closed position before and after stopping the power supply to the motor 6. As a result, the deterioration of exhaust gas and/or drivability as well as the noise generation caused by the rapid movement of the EGR valve can be prevented, even when the power supply to the motor is stopped.

(Modification)

According to the above first embodiment, the fully closed position of the EGR valve device is the condition for carrying out the process for detecting the abnormal condition (i.e. the condition for stopping the power supply to the motor 6 for driving the EGR valve device), under the condition that the EGR control is in its operation during the engine running. According to the modification, however, a non-operating condition of the engine may be selected as the condition for carrying out the process for detecting the abnormal condition.

During the engine is not operated, the power supply to the motor 6 is generally stopped in view of saving the energy consumption, and thereby the motor 6 is in its initial position.

Accordingly, the same effect to the first embodiment can be obtained in such modification.

(Second Embodiment)

Figure 5:
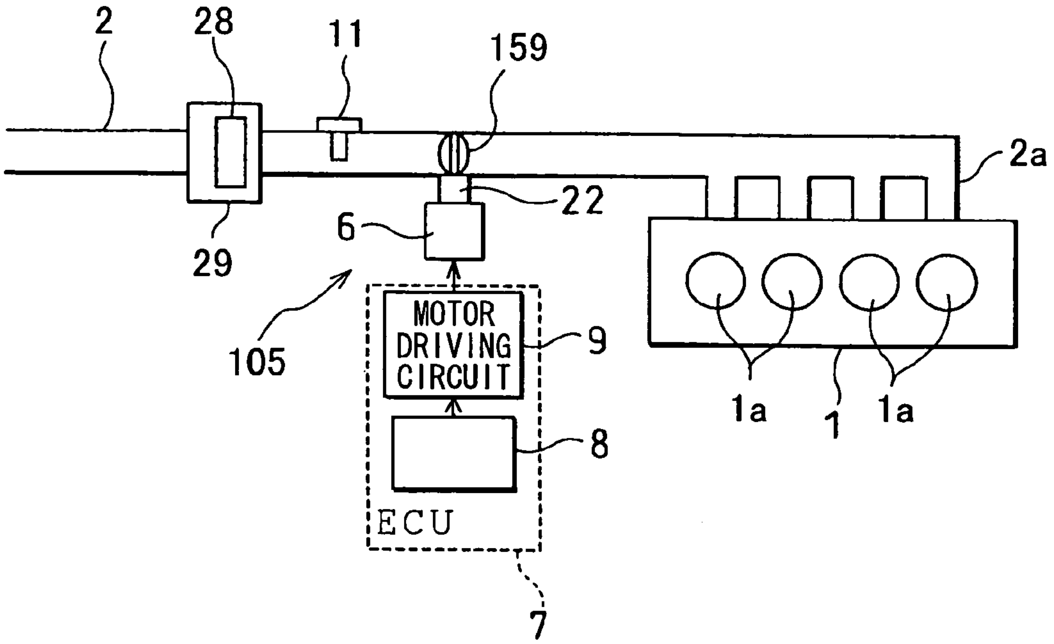
FIG. 5 is a schematic view showing a throttle control apparatus for an internal combustion engine, according to a second embodiment of the present invention.

A second embodiment will be explained with reference to FIG. 5, wherein the same reference numerals designate the same or similar apparatus, device, and parts in the first embodiment. The explanation thereof is omitted.

In the second embodiment, the invention is applied to a throttle control apparatus 105 having a valve device, which is composed of the motor 6, a valve position sensor 22, and a throttle valve 159 (also referred to as the control member). An air filter 28 is provided in a casing 29 of an air cleaner arranged at an upstream side of the throttle control apparatus 105. The intake air, the volume of which is controlled by the throttle control apparatus 105, is supplied into combustion chambers 1*a* of the respective engine cylinders through intake ports 2*a* of the engine 1.

The throttle valve 159 is a butterfly valve of a disc shape, which is rotated in the intake pipe 2 by the motor 6 between its fully closed position (the opening degree thereof is 0%) and its fully opened position (the opening degree thereof is 100%). The throttle valve 159 is held at its fully opened position, when the engine is operated at its full acceleration, or after the lapse of a certain period since the engine operation is stopped.

The ECU 7 carries out a control for detecting an abnormal condition of the throttle control apparatus 105, in addition to the fuel injection control, the EGR control, a throttle control and so on. In the throttle control operation, the ECU 7 calculates an amount of a target opening degree of the throttle valve 159 based on the operational condition of the engine 1 (e.g. the rotational speed of the engine, the fuel injection amount, etc.). The ECU 7 drives the motor 6 such that an actual opening degree (an actual throttle position) of the throttle valve 159, which is detected by the position sensor 22, coincides with the target opening degree as calculated above.

An operation for detecting the abnormal condition of the throttle control apparatus 105, more particularly, the abnormal condition of the motor 6 and/or the power supply lines, will be explained with reference to FIG. 6, which is similar to the flow chart of FIG. 4 for the first embodiment.

At a step S301, the ECU 7 starts an operation of the throttle control, when the ignition key is turned on to start the engine operation.

At a step S302, the ECU 7 determines whether the condition for detecting the abnormal condition is satisfied or not. More specifically, the ECU 7 determines whether the throttle valve 159 is in its fully opened position based on the detected signal from the position sensor 22. And when the throttle valve 159 (the control member) is in the fully opened position (the initial position), the ECU 7 determines that the condition for detecting the abnormal condition (malfunction) is satisfied.

Then, the process goes to a step S303, at which the operation for the throttle control is temporally stopped, namely the power supply from the motor driving circuit 9 to the motor 6 is temporally stopped, during a period in which the operation for detecting the abnormal condition is performed.

Figure 6:
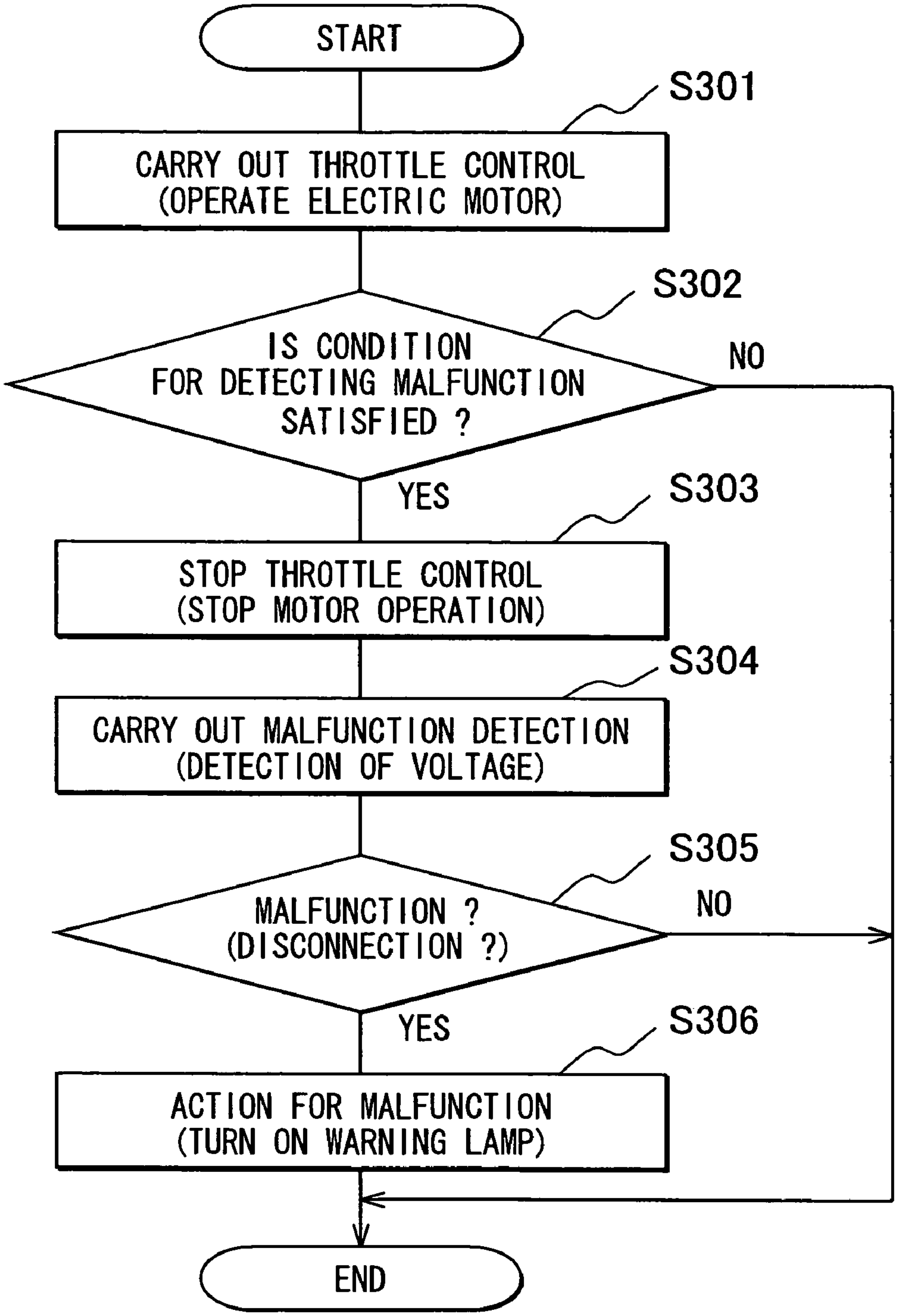
FIG. 6 is a flow chart of a control process for detecting an abnormal condition of the throttle control apparatus.

Steps S304 to S306 in FIG. 6 are the same to the steps S204 to S206 in FIG. 4.

According to the above second embodiment of the invention, the initial position of the motor 6 for carrying out the process of stopping the power supply corresponds to the fully opened position of the throttle valve 159, namely it corresponds to an engine operation in which the amount of the intake air is at its maximum value (the engine accelerating operation of the full throttle). Therefore, even when the power supply to the motor 6 is stopped during such engine operation, for the purpose of detecting the abnormal condition of the throttle control apparatus 105, the actual opening degree of the throttle valve 159 is maintained at its fully opened position before and after stopping the power supply to the motor 6. As a result, the deterioration of drivability as well as the noise generation caused by the rapid movement of the throttle valve to its initial position can be prevented, even when the power supply to the motor 6 is stopped.

(Modification)

According to the above second embodiment, the fully opened position of the throttle valve 159 is selected as the condition for carrying out the process for detecting the abnormal condition (i.e. the condition for stopping the power supply to the motor 6), under the condition that the throttle control is in its operation during the engine running. However, a non-operating condition of the engine may be selected as the condition for carrying out the process for detecting the abnormal condition.

During the engine is not operated, the power supply to the motor 6 is generally stopped in view of saving the energy consumption, and thereby the motor 6 is in its initial position.

Accordingly, the same effect to the second embodiment can be obtained in such modification.

(Third Embodiment)

Figure 7:
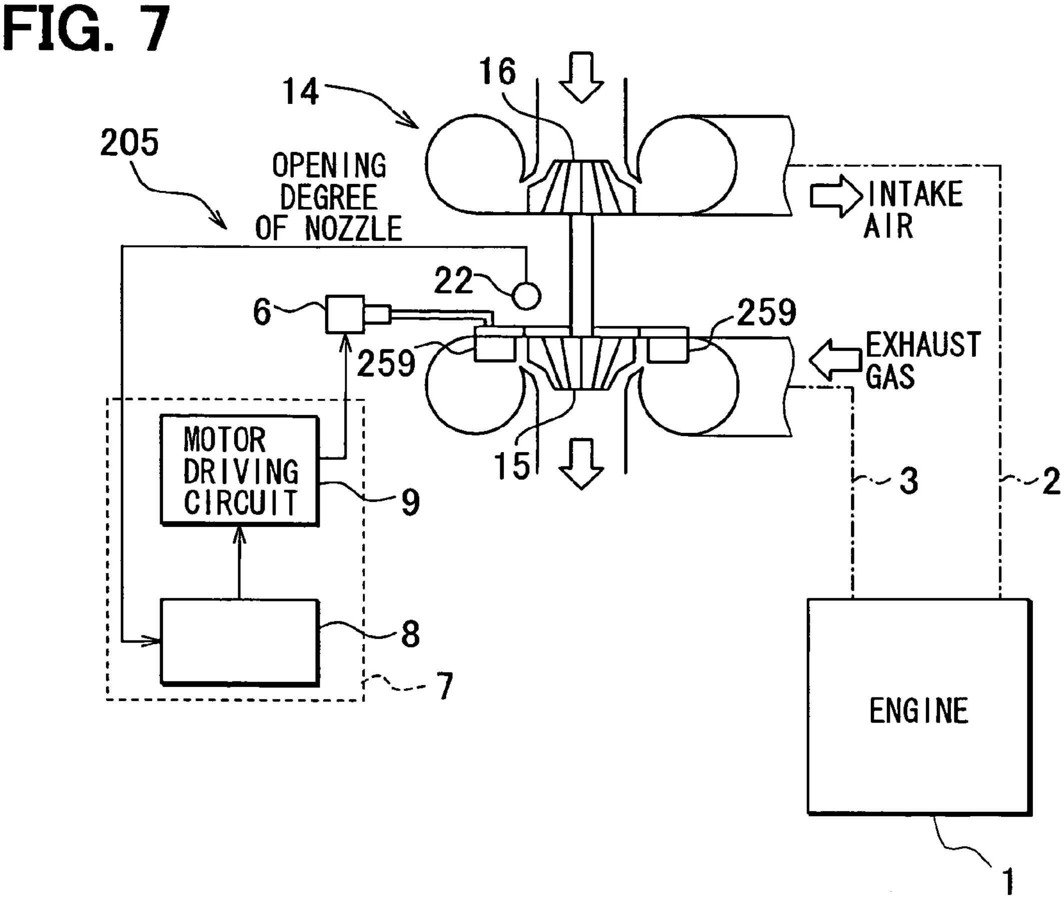
FIG. 7 is a schematic view showing a supercharging apparatus for an internal combustion engine, according to a third embodiment of the present invention.

A third embodiment will be explained with reference to FIG. 7, wherein the invention is applied to a supercharging apparatus 205 for controlling a supercharging pressure of the intake air to the engine 1.

The supercharging apparatus 205 has a turbocharger 14 and a variable nozzle device. The turbocharger 14 has a turbine wheel 15 and a compressor impeller 16, wherein the turbine wheel 15 is driven to rotate by the exhaust gas flowing through the exhaust pipe 3, whereas the compressor impeller 16 is operated by the turbine wheel 15. The compressor impeller 16 compresses the intake air flowing through the intake pipe 2 and supercharges the compressed intake air to the engine 1.

The variable nozzle device adjusts flow velocity and pressure of the exhaust gas to be supplied to the turbine wheel 15, wherein the flow velocity and the pressure are adjusted by changing a cross sectional area of an exhaust gas flow passage in a turbine chamber. The turbocharger 14 adjusts a balance between a back pressure and the supercharging pressure with respect to the rotational speed and load of the engine, by adjusting an opening degree of the nozzle of the variable nozzle device.

More exactly, the variable nozzle device is composed of the motor 6, a position sensor 22, a nozzle vane 259 (also referred to as the control member), and a unison ring (not shown) for converting the movement of the motor 6 to an opening or closing movement of the nozzle vane 259. When the unison ring is rotated in one direction (a forward direction), the nozzle vane 259 is moved in a nozzle closing direction, whereas the unison ring is rotated in the opposite direction (a backward direction), the nozzle vane 259 is moved in a nozzle opening direction. The cross sectional area of the exhaust gas flow passage is controlled by the position (the opening degree) of the nozzle vane 259.

The nozzle vane 259 is moved by the motor 6 between its fully closed position and its fully opened position. The nozzle vane 259 is held at its fully closed position, when the engine is in its idling operation.

The motor 6 is linked with the unison ring via a link (not shown) for moving the nozzle vane 259 in the opening or closing direction. The position sensor 22 detects the opening degree of the nozzle valve 259.

An operation for detecting the abnormal condition of the supercharging apparatus 205, more particularly, the abnormal condition of the motor 6 and/or the power supply lines, will be explained with reference to FIG. 8, which is also similar to the flow chart of FIG. 4 for the first embodiment.

At a step S401, the ECU 7 starts an operation of the supercharging control, when the ignition key is turned on to start the engine operation.

At a step S402, the ECU 7 determines whether the condition for detecting the abnormal condition is satisfied or not. More specifically, the ECU 7 determines whether the nozzle vane 259 is in its fully opened position based on the detected signal from the position sensor 22. And when the nozzle vane 259 (the control member) is in the fully opened position (the initial position), the ECU 7 determines that the condition for detecting the abnormal condition is satisfied.

Then, the process goes to a step S403, at which the operation for the supercharging control is temporally stopped, namely the power supply from the motor driving circuit 9 to the motor 6 is temporally stopped, during a period in which the operation for detecting the abnormal condition is performed.

Figure 8:
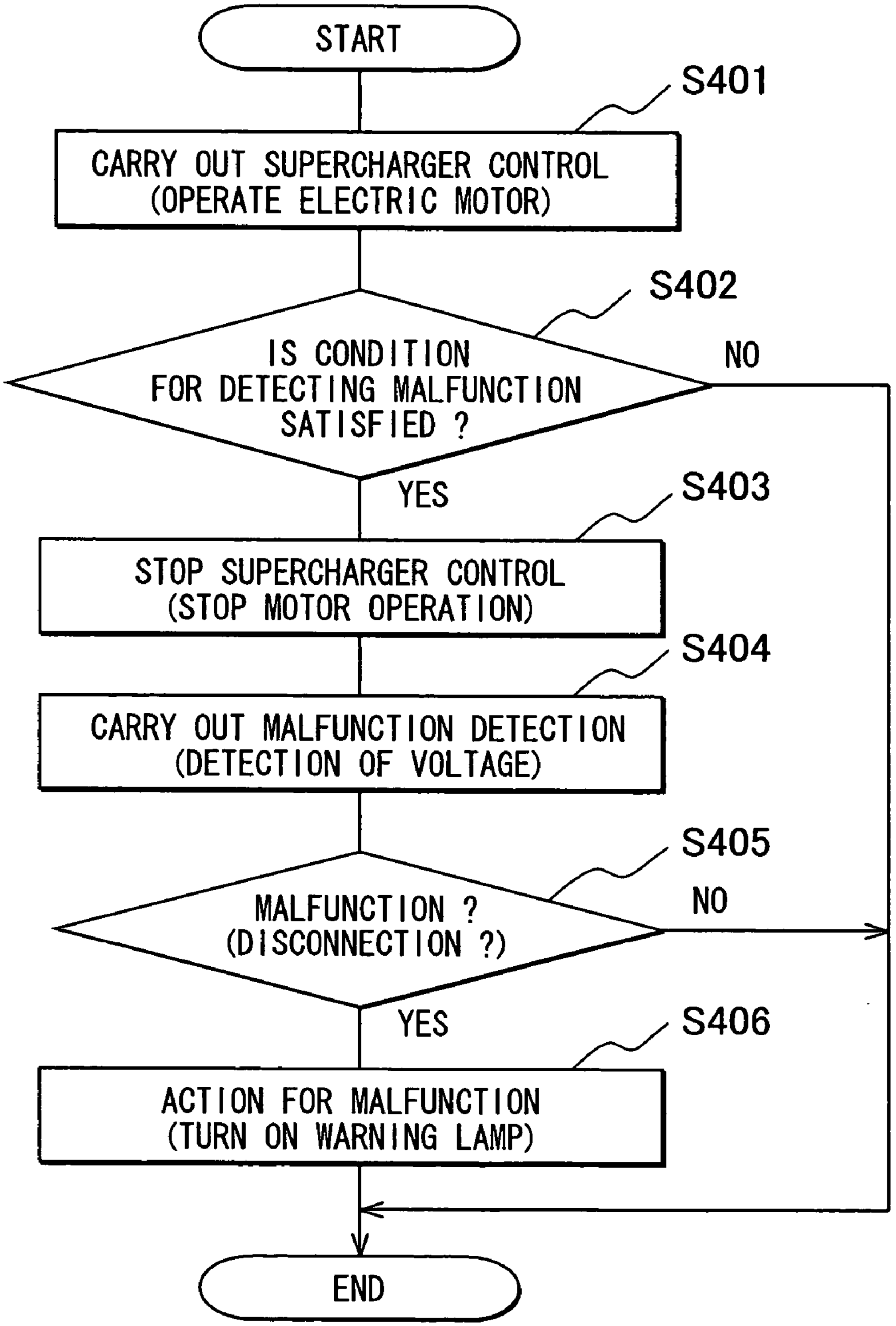
FIG. 8 is a flow chart of a control process for detecting an abnormal condition of the supercharging apparatus.

Steps S404 to S406 in FIG. 8 are the same to the steps S204 to S206 in FIG. 4.

As above, the same effect to the first and second embodiment can be obtained in the third embodiment.

As in the same manner to the first and second embodiments, a non-operating condition of the engine may be selected as the condition for carrying out the process for detecting the abnormal condition.

(Further modifications)

(1) In the engine control system of the above first to third embodiments, the physical quantity, such as the amount of the EGR gas, the amount of the intake air, the supercharging pressure, and so on is controlled and/or adjusted. In such engine control system, malfunction may occur not only in the electrical parts (e.g. disconnection in the power supply lines) but also in mechanical parts. For example, in the EGR apparatus of the first embodiment, the valve bodies 59 may be firmly fixed to the valve seats 58. In such a mechanical malfunction, the EGR valve device must be dismounted from the engine 1 and a failure diagnosis is carried out, to repair the parts for the malfunction. It is, therefore, important to surely detect the mechanical malfunction before the device is dismounted from the engine, in order to avoid a useless dismounting process.

Figure 9:
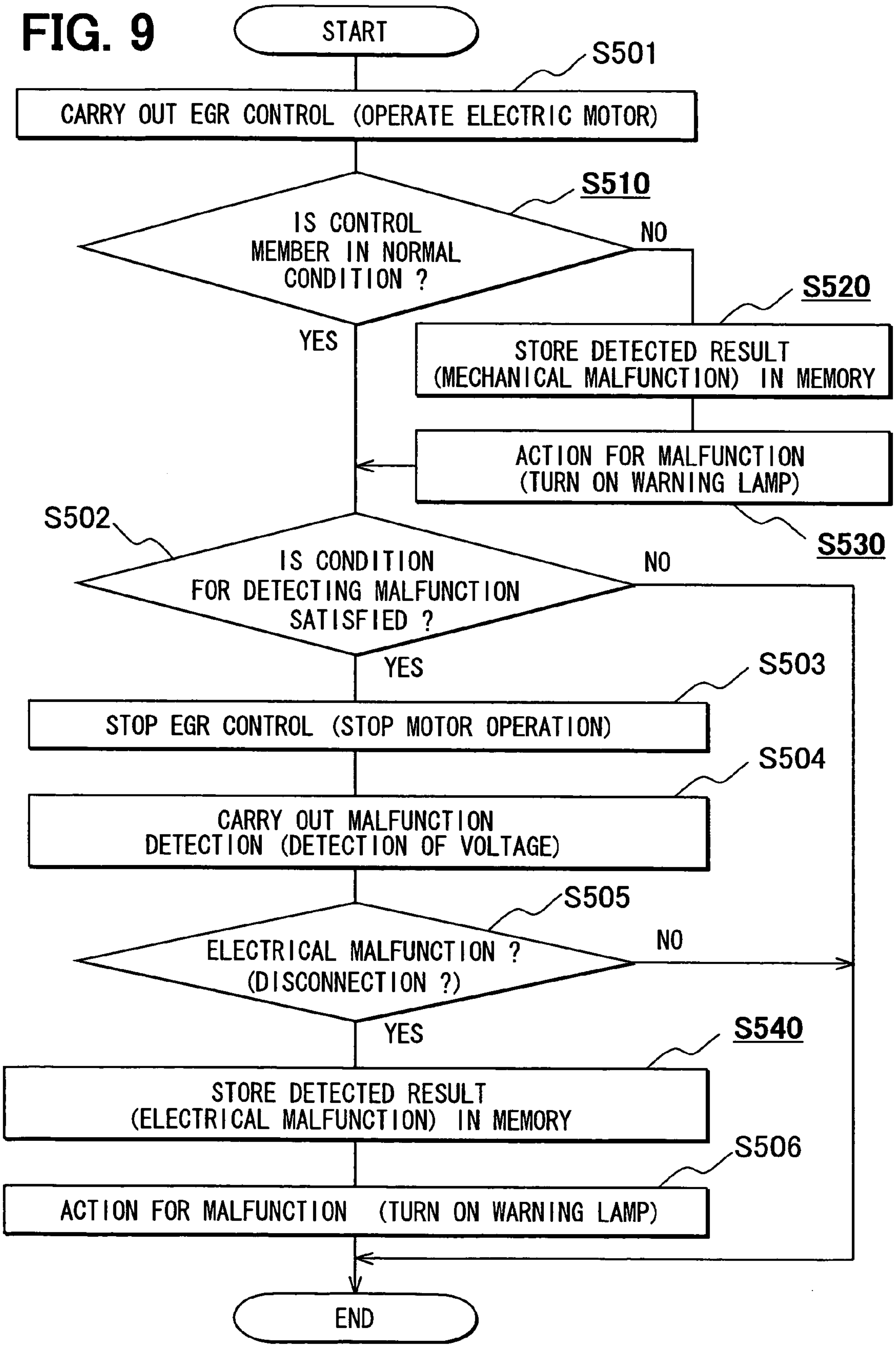
FIG. 9 is a modified flow chart of a control process for detecting an abnormal condition of the EGR control apparatus.

According to a further embodiment of the invention, as shown in FIG. 9, steps S501 to S506 are the same to the steps S201 to S206 of the first embodiment (FIG. 4). Steps S510, S520, and S530 are added between the steps S501 and S502. At the step S510, the ECU 7 detects whether the valve bodies (the control member) 59 are operated in a normal condition or not, after the operation of the EGR control is started. The detection of the mechanical malfunction is carried out in the following manner. The detection is carried out during the EGR control is in operation, namely the valve bodies (the control member) 58, 59 must be moved to any opening position from its initial (closed) position, when the control member is in the normal condition. Therefore, when the ECU 7 determines from the signal of the position sensor 22 that the valve bodies (the control member) are kept at the initial position, the ECU 7 detects that the valve bodies have been firmly fixed to the valve seats.

In the case of "NO" at the step S510, namely when there is the mechanical malfunction (e.g. the valve bodies 59 are firmly fixed to the valve seats 58), the process goes to a step S520 at which the detected mechanical malfunction is stored in the memory device of the ECU 7. Then, the process goes on to a step S530, at which a warning for such mechanical malfunction is carried out to the vehicle driver by turning on a warning lamp.

The process further goes from the step S530 to the step S502, or the process goes from the step S510 to the step S502 when the determination at the step S510 is "YES". At the step S502, the ECU 7 determines whether the condition for carrying out the process for detecting the electrical malfunction is satisfied. At the steps S503, S504 and S505, the electrical malfunction is detected as in the same manner to the first embodiment (S203 to S205 of FIG. 4).

In the case that the ECU 7 determines that there is the electrical malfunction at the step S505, the detected electrical malfunction is stored in the memory device of the ECU 7 at a step S540, as in the same manner to the step S520. At the step S506, a warning for such electrical malfunction is carried out to the vehicle driver by turning on the warning lamp.

According to the above modification (FIG. 9), the electrical malfunction (e.g. the disconnection in the motor 6 or in the power supply lines 6*a*, 6*b*) and the mechanical malfunction (e.g. fixing of the valve bodies 59 to the valve seats 58) can be separately detected. As a result, useless dismounting of the EGR valve device from the engine 1 can be avoided.

In the above modification (FIG. 9), the mechanical malfunction is detected at the step S510, when the valve bodies 59 are firmly fixed to the valve seats 58 at the fully closed position. In addition to the case of the valve bodies 59 which are firmly fixed to the valve seats 58, the mechanical malfunction may be detected when the valve bodies 59 are not moved to a desired valve position in accordance with a target position (hereinafter also referred to as an improper operation).

When such an improper operation of the valve bodies is detected at the step S510, the power supply to the electric motor 6 is stopped at the step S503 for carrying out the detection of the electrical malfunction at the steps S504 and S505. In this case, since the valve bodies 59 are improperly operated, the cut off of the power supply to the electrical motor 6 (the stop of the motor operation) may not adversely affect the EGR control operation.

As explained above, the detected malfunctions (the electrical and mechanical malfunctions) are separately memorized in the memory device of the ECU 7 (the steps S530 and S540). When the vehicles brought into a repair plant, the malfunction diagnosis is carried out by reading out the memorized information, in order to specify which malfunction has occurred in the vehicle. Therefore, the useless dismounting of the EGR valve device from the engine 1 can be avoided when repairing the device.

(2) In the case the malfunction has happened to occur, for example in the EGR control apparatus, an appropriate proceeding should be quickly taken. The proceedings to be taken, however, may be different between the case in which the electrical malfunction in the motor 6 and/or the power supply lines 6*a*, 6*b* has occurred and the case in which the mechanical malfunction has occurred.

The ECU 7 may be provided with a further process, according to which the ECU 7 selects the proceedings to be taken depending on the detected malfunction, for example a failsafe operation of the engine, an evacuating running of the vehicle with a limited (low) vehicle speed, and so on.

Figure 10:
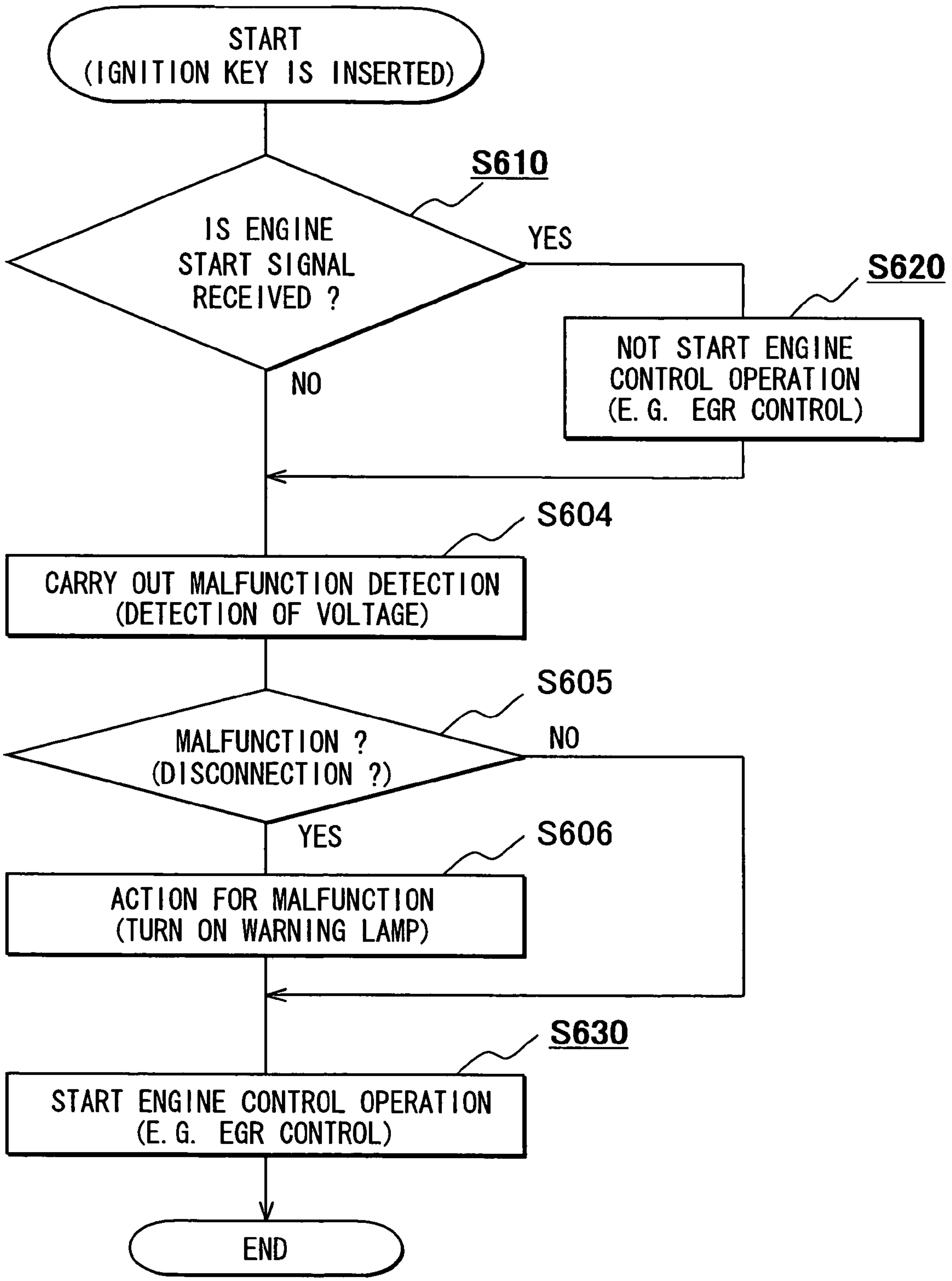
FIG. 10 is a further modified flow chart of a control process for detecting an abnormal condition of the EGR control apparatus.

(3) As already explained in the above first and second embodiments, the non-operating condition of the engine may be selected as the condition for carrying out the process for detecting the abnormal condition. In such a case, a period from a time point at which an ignition key is inserted into a key cylinder to a time point at which the engine operation is started, may be selected as a period which satisfies the condition for carrying out the process for detecting the malfunction. As shown in FIG. 10, at a step S610, the ECU 7 determines whether an engine start signal is received, and the ECU 7 performs the steps S604 to S606 when the ECU 7 determines that the engine start signal is not received. The steps S604 to S606 in FIG. 10 are identical to the steps S204 to S206 of FIG. 4, and the electrical malfunction is detected, as in the same manner to the process of FIG. 4.

Furthermore, as shown in FIG. 10, an additional step S620 may be added between the steps S610 and S604. At the step S620, the ECU 7 does not start the operation of the engine control (e.g. the EGR control) even when the ECU 7 receives the engine start signal. Namely, at the step S620, the ECU 7 does not start the operation of the EGR apparatus 5 (not supply the power to the electric motor 6), even when the engine operation itself has been started.

After the steps S604 to S606 have been carried out, namely when the detection process for the electrical malfunction has been ended, the process goes on to a step S630, at which the operation of the EGR apparatus 5 (supply of the electrical power) is started.

According to the above modification (FIG. 10), since the supply of the electrical power to the electric motor 6 is prohibited until the detection process for the malfunction has been ended, the abnormal condition of the EGR apparatus can be detected without affecting the operation of the engine.

What is claimed is:

1. An abnormal condition detecting device for an engine control system comprising:

an electric motor and a control member driven by the electric motor for controlling physical quantity related to engine performance;

a position sensor for detecting a position of the control member; and an electronic control unit for driving the electric motor in accordance with operational condition of an engine, so that an actual physical quantity is controlled to reach a target physical quantity calculated by the electronic control unit based on the operational condition of the engine, wherein the electronic control unit comprises:

a motor driving circuit for supplying electrical power to the electric motor through power supply lines; and an abnormal condition detecting circuit for detecting an electrical abnormal condition of the electric motor and/or the power supply lines, when the power supply from the motor driving circuit to the electric motor is stopped, and wherein the electronic control unit performs:

detecting whether an engine start signal is received after an ignition key is inserted into a key cylinder of a vehicle;

determining that a condition for detecting the abnormal condition for the electric motor and/or power supply lines is satisfied, when the ignition key is inserted into the key cylinder and the engine start signal is not received; and determining whether any electrical abnormal condition occurs in the electric motor and/or the power supply lines.

2. An abnormal condition detecting device according to claim 1, wherein the electronic control unit further performs:

delaying an operation of the electric motor until the detection process for the abnormal condition has been ended.

* * * * *